United States Patent [19]
Koyanagi et al.

[11] Patent Number: 6,037,278
[45] Date of Patent: Mar. 14, 2000

[54] METHOD OF MANUFACTURING SEMICONDUCTOR DEVICES HAVING MULTI-LEVEL WIRING STRUCTURE

[75] Inventors: Ken-Ichi Koyanagi; Koji Kishimoto, both of Tokyo, Japan

[73] Assignee: NEC Corporation, Tokyo, Japan

[21] Appl. No.: 08/920,906

[22] Filed: Aug. 29, 1997

[30] Foreign Application Priority Data

Aug. 30, 1996 [JP] Japan .................................. 8-230368

[51] Int. Cl.$^7$ ...................................................... H01L 1/00
[52] U.S. Cl. ........................ 438/787; 438/680; 438/637; 438/672; 438/675; 438/778; 438/781; 438/783; 438/788; 438/789; 438/790
[58] Field of Search .................................. 438/680, 778, 438/781, 783, 787, 788, 789, 790, 637, 672, 675

[56] References Cited

U.S. PATENT DOCUMENTS

| | | | |
|---|---|---|---|
| 5,492,843 | 2/1996 | Adachi et al. | 437/21 |
| 5,776,804 | 7/1998 | Hayashi | 438/162 |
| 5,827,769 | 10/1998 | Aminzadeh et al. | 438/305 |
| 5,837,614 | 11/1998 | Yamazaki et al. | 438/789 |

FOREIGN PATENT DOCUMENTS

| | | |
|---|---|---|
| 4-100233 | 4/1992 | Japan . |
| 4-286122 | 10/1992 | Japan . |
| 5-343534 | 12/1993 | Japan . |
| 6-232402 | 8/1994 | Japan . |
| 8-288285 | 11/1996 | Japan . |
| 9-148323 | 6/1997 | Japan . |
| 9-289247 | 11/1997 | Japan . |

OTHER PUBLICATIONS

Takahiro Tamura, et al., "Controllability of gap-filling for deposition of inter metal SiO$_2$ dielectric by biased helicon plasma CVD", pp. 227–233, DUMIC Conference, Feb. 21–22, 1995.

Dr. W.G.M. van den Hoek, et al., "A new high density plasma source for void free dielectric gap fill", pp. 195–200, Novellus Systems, Inc.

B.M. Somero et al., "A modular in–situ integration scheme for deep submicron CMOS logic and ASIC applications", pp. 28–34, VMIC Conferences, Jun. 8–9, 1993.

Stephan E. Lassig et al., "Dielectric properties of SiO$_2$ formed by biased ECR CVD", pp. 122–124, VMIC Conference Jun. 8–9, 1993.

Primary Examiner—John F. Niebling
Assistant Examiner—David A. Zarneke
Attorney, Agent, or Firm—Young & Thompson

[57] ABSTRACT

Disclosed is a method of manufacturing a semiconductor device aimed at improving reliability of wiring, more particularly, of a via hole when a silicon oxide film formed by a high density plasma CVD process is used as an inter-level dielectric film in an integrated circuit having a multi-level wiring structure. When the multi-level wiring structure is formed on a semiconductor substrate, after underlying wiring is formed, a silicon oxide film is formed on the entire surface of the substrate by a high density plasma CVD process, and heat treated in inert gas or oxygen atmosphere at a temperature of 300° C. or more but 500° C. or less for 10 minutes or more. Excess hygrogen incorporated in the silicon oxide during the CVD process is removed by the above heat treatment. Subsequently, via holes are opened, and upper wiring is formed.

11 Claims, 12 Drawing Sheets

SIMS ANALYSIS

THERMAL DESORPTION SPECTRUM

216 LOCATION OF VOID

METHOD OF MANUFACTURING SEMICONDUCTOR DEVICES HAVING MULTI-LEVEL WIRING STRUCTURE

BACKGROUND OF THE INVENTION

1. Field of the Invention

The present invention relates to a manufacturing process of semiconductor device, and, more particularly, to a manufacturing process of semiconductor device having a multi-level wiring structure.

2. Description of the Related Art

As an integrated circuit is integrated in higher and higher density, it is essential to employ multi-level wiring in constituting a semiconductor device. A silicon oxide type dielectric film is frequently used for an inter-level dielectric film of a semiconductor device with multi-level wiring to reduce parasitic capacitance between wiring. A silicon oxide film formed by a plasma chemical vapor deposition is widely used as an inter-level dielectric film for aluminum type wiring because it can be formed at a relatively low temperature of 500° C. or less, and has good film quality. Description is given in the following on a process for forming a multi-level wiring structure presented by B. M. Somero et al. on the VLSI Multilevel Interconnection Conference, 1993.

As shown in FIG. 9(a), underlying wiring is formed on a semiconductor substrate 201. The wiring has a multi-level structure. First, a first titanium film 202 and a first titanium nitride film 203 are continuously formed in a same processing chamber. The titanium film and the titanium nitride film are used for improving migration resistance characteristics of the wiring. Then, a copper containing aluminum film 204 and a second titanium nitride film 205 are formed by a sputtering process. Containing copper in the aluminum film is also aimed at improving migration resistance characteristics. The top titanium nitride film 205 is used for preventing optical reflection since a desired pattern cannot be obtained if light is reflected on an aluminum film during exposure in a photolithography process for forming wiring.

After the underlying wiring is formed, as shown in FIG. 9(b), a plasma silicon oxide film 206 is formed by a parallel-plate type plasma chemical vapor deposition using tetraethylorthosilicate and oxygen as materials.

Since the surface of plasma silicon oxide film 206 is non-planar reflecting the profile of underlying wiring, if the upper level wiring is formed as it is, reliability of the wiring is deteriorated due to physical breakdown (disconnection) of the wiring. Therefore, to obtain good planarity, this example comprises applying photoresist on the plasma silicon oxide film 206, and heat treating it, followed by etch back to obtain the profile of FIG. 9(c). Although the conventional process employs the above approach, it may employ other approaches such as a spin-on-glass film or chemical mechanical polishing.

After the surface of the first silicon oxide film is planarised, contact holes (via holes) 209 are formed for electrically connecting the underlying wiring by photolithography, whereby the structure shown in FIG. 9(d) is obtained. In opening a via hole, the second titanium nitride film 205 on the top of underlying wiring is also etched to reduce contact resistance so that the first copper containing aluminum film 204 is exposed to the bottom of via hole.

Then, as shown in FIG. 10(a), a second titanium film 210 and a third titanium nitride film 211 are formed with a sputtering process. The second titanium film 210 is essential to reduce contact resistance at the bottom of via hole. Since aluminum is very easily oxidized, via hole resistance increases if aluminum oxide is formed on the copper containing aluminum wiring at the bottom of the via hole. On the other hand, titanium exhibits strong reduction (deoxidizing) characteristics. Accordingly, when a thin titanium film is formed, the titanium reduces aluminum oxide, so that increase of resistance is suppressed. Oxide of titanium also has high resistance, but, unlike aluminum, is not formed all over the bottom of via hole, but aggregates on one area, so that there is no increase of resistance.

The third titanium nitride film 211 is used for preventing a subsequently formed tungsten film from being peeled off, and as a stopper layer in a case where the global etch back is performed after the tungsten film is formed. If the tungsten film is directly formed on the titanium film 210, the tungsten film may be peeled off. In addition, since there is a large difference in the etching rate between titanium nitride and tungsten during dry etching, it becomes possible to etch tungsten without leaving it on areas other than the via hole when the etch back is performed to leave tungsten only in the inside of via hole.

Then, the via hole 209 is filled with tungsten 212 to obtain a structure shown in FIG. 10(b). The structure shown in FIG. 10(b) can be obtained by first forming tungsten on the entire surface of a wafer by chemical vapor deposition, and leaving the tungsten only in the inside of via hole 209 by etching back the entire surface.

Subsequently, similar to the underlying wiring, a second copper containing aluminum film and a fourth titanium nitride film are formed by sputtering, then a desired wiring pattern is formed, thereby a multi-level wiring structure as shown in FIG. 10(c) can be obtained.

However, according to this approach, a void 207 is generated in the underlying wiring of the plasma silicon oxide film 208 as spacing between the wirings become narrow This is caused from the fact that the film formation rate of the plasma oxide silicon film is higher at the upper corner of the wiring than on the side wall of the wiring or the valley between the wiring. If a void is caused between the wiring, gas contained in the void is repeatedly expanded and contracted in heating and cooling in the subsequent steps. Since the inter-level dielectric film does not have flexibility enough to absorb such expansion or contraction of the volume of gas in the void, such force would be applied to the wiring. If a large force is applied to the wiring during heating and cooling, the reliability of the wiring deteriorates significantly due to stress migration or the like. Accordingly, it is necessary to have a technique for forming an inter-level dielectric film so that no void is generated between the wiring.

The process not to generate the void includes a high density plasma CVD process which forms a film while applying high frequency power to a substrate. This process performs sputter etching at the same time while the film is formed. In the sputter etching, the upper corner of the wiring is more effectively etched than at other areas. Consequently, the upper corner of the wiring has a lower film formation speed so that the void does not tend to be generated between the wiring.

Since this process performs etching at the same time as the film formation, the film formation speed would be lowered. Thus, it is a typical approach to effectively decompose the film forming material by generating high density plasma, thereby increasing the film formation speed (high density plasma CVD process). In the following, a process for forming a film with the high density plasma CVD process while applying bias to the substrate is simply called a high density plasma CVD process.

The high density plasma CVD process includes an ECR plasma CVD process using electron cyclotron resonance which was reported by S. E. Lassig et al. on the VLSI Multilevel Interconnection Conference, 1993; a helicon plasma CVID plasma using helicon wave which was reported by T. Tamura et al. on the Dielectric for VLSI/ULSI Multilevel Interconnection Conference, 1995; and an ICP-CVD process using inductively coupled plasma which was reported by W. van den Hoek et al. on the SEMI Technology Seminar, 1994.

When the inter-level dielectric film is formed by the high density plasma CVD process, it is possible to obtain a multi-level wiring structure free from a void in the silicon oxide film even in a narrow wiring spacing as shown in FIG. 11. However, this process has various problems.

When the inter-level dielectric film formed by the high density plasma CVD process is used for the multi-level wiring structure described in conjunction with the related art, the reliability is degraded for a contact hole (via hole) electrically connecting an upper wiring and an underlying wiring.

It is because the silicon oxide film of the high density plasma CVD used as the inter-level dielectric film contains much amount of hydrogen, and the hydrogen is out-diffused and desorbed after the multi-level wiring structure is formed.

A dual-level wiring structure shown in FIG. 11 was formed by using a silicon oxide film, which was formed by the high density plasma CVD process described in conjunction with the related art, as an inter-level dielectric film. Then, its via hole-electrical resistance characteristics were evaluated by the following method.

To evaluate the reliability of the structure shown in FIG. 11 after it was formed, via hole resistance immediately after formation of a via hole was measured. Then, heat treatment (raised temperature test) was conducted for 60 minutes at 450° C. in nitrogen atmosphere, for 60 minutes at 500° C., 10 hours at 500° C. in this order. The via hole resistance was measured every time. The via holes were arranged in a chain of 2000 holes. The represented resistance was the value per hole. As shown in FIG. 12, after the raised temperature test was conducted in nitrogen atmosphere at 500° C. for 10 hours, the via bole resistance increased by about 22 times in comparison with that before the raised temperature test. The reason appears to lie in the following.

First, to determine change of the inter-level dielectric film during the heat treatment, a silicon oxide film was formed on a silicon substrate in a thickness of 600 nm by the ICP-CVD process which was one of the high density plasma CVD process, and then, a Theremal Desorption Spectrum analysis (TDS method) was conducted. A six-inch silicon substrate was used for film formation. The film was formed by using monosilane, oxygen and argon at flow rate 30 sccm, 40 sccm and 30 sccm, respectively. High frequency wave of a frequency of 2.0 MHz and with power of 3000 V was applied to a plasma source so as to generate high density plasma. In addition, high frequency bias current was applied to the substrate so as to generate self-bias. The bias frequency at the moment was 1.8 MHz, and the power was 1500 W.

As seen from theTDS shown in FIG. 13, an element with mass number of 2, i.e. hydrogen was desorbed in a much amount. The desorption of hydrogen caused a peak at 400° C. or less. Accordingly, it is believed that the silicon oxide film formed by the high density plasma CVD process contains much hydrogen, and much amount of hydrogen is desorbed during the raised temperature test. The hydrogen appears to be taken into the silicon oxide film during the high density plasma CVD. That is, in the high density plasma CVD process, high RF power is applied to the substrate during film formation. This applies high self-bias on the substrate. The self-bias is applied in such a manner that the substrate is negatively charged with respect to the plasma. Since hydrogen ion generated through decomposition of the film material $SiH_4$ is a positive ion, it is strongly attracted toward the substrate, whereby much ion is taken into the silicon oxide film.

It is known that, when hydrogen reacts with titanium, volatile $TiH_x$ is generated. Accordingly, if a semiconductor device has a structure where an inter-level dielectric film contacts titanium, there is a possibility of risk that, when much hydrogen is generated, titanium becomes fragile around the boundary between them.

In addition, when reliability is measured for the multi-level wiring structure shown in FIG. 12, warp was measured for wafers before and after the raised temperature test. As shown in FIG. 14, the warp is significantly varied before and after the raised temperature test. The warp of wafer was about 27 $\mu$m before the raised test, while it was about 16 $\mu$m immediately after the raised temperature test was conducted in nitrogen environment at 450° C. for 60 minutes. The warping was reduced by about 11 $\mu$m. Furthermore, the warp of wafer was about 4 $\mu$m after the raised temperature test at 500° C. for 10 hours, which showed reduction of about 23 $\mu$m compared with that before the test. It is believed that, as described above, when the heat treatment is conducted, much hydrogen is desorbed from the silicon oxide film formed by the high density plasma CVD process. On the other hand, the reason why the warp increases when the wafer is left after the raised temperature test believingly lies in that water in the atmosphere where the wafer is left is absorbed to bonds which are broken when hydrogen desorbed, thereby the warp being released. Accordingly, it can be seen that warp of a wafer is significantly varied by conducting the raised temperature test, and very high force is applied to the via hole.

After the via hole resistance was measured after the raised temperature test at 500° C. for 10 hours, the cross section of the via hole was observed with a scanning electron microscope (SEM). It was found that, as shown in FIG. 15, although the bottom of via hole was not peeled off from the underlying layer when compared with the state before the raised temperature test (FIG. 11), the bottom of via hole which should exist below an anti-reflection coating of the underlying wiring existed above the anti-reflection coating. This is believingly caused by the fact that mechanical force is applied to the via hole when the raised temperature test is conducted at 500° C., so that the bottom of via hole is raised. Since the measurement pattern consists of a chain of 2000 via holes, it is difficult to confirm all the via holes. Accordingly, it is expected that, while there is no broken wire at the area where the observation is conducted, there are via holes exhibiting high resistance due to partial peeling.

In view of the above results, the reason why the via hole resistance is significantly varied when a wafer is maintained at a high temperature for an extended period of time is believed to lie in the fact that titanium becomes fragile within a via hole as excess hydrogen is desorbed from the high density plasma CVD silicon oxide film, thereby deteriorating adherence at the interface between the bottom of via hole and aluminum wiring. Further, as large force is applied to the via hole due to the warping of the wafer being significantly varied during heat treatment, the bottom of via hole is cause to raise from the underlying wiring, so that the via hole resistance is increased. When the silicon oxide film is formed with the high density plasma CVD process, it is unavoidable that excess hydrogen is contained in the film, as described above. Therefore, when the silicon oxide film formed by the high density plasma CVD process is used as the inter-level dielectric film, it is expected to be effective that hydrogen in the film is previously removed after formation of the film.

BRIEF SUMMARY OF THE INVENTION

It is therefore, an object of the present invention to provide a multi-level wiring structure formed with via holes providing high reliability when a silicon oxide film is used as an inter-level dielectric film, the silicon oxide film being capable of burying minute spaces between wiring and being formed by a high density plasma CVD process.

A manufacturing process of a semiconductor device according to the present invention is to form a plurality of multi-level wiring on the surface of the semiconductor device through a dielectric film, the method comprising the steps of forming an underlying wiring; forming an inter-level dielectric film on the underlying wiring using at least one silicon oxide film, the silicon oxide film being formed by a high density plasma chemical vapor deposition process using at least monosilane and oxygen as materials while applying high frequency power to a semiconductor substrate; removing at least part of excess hydrogen in the silicon oxide film; forming contact holes in the inter-level dielectric film and reaching the underlying wiring; and forming an upper layer with a laminated structure using a titanium layer as the lowermost level. The process for generating high density plasma is any one of a process using electron cyclotron resonance, a process using helicon wave, or a process using inductively coupled plasma. Preferably, the step of removing excess hydrogen in the silicon oxide film is heat treatment in atmosphere containing at least one of nitrogen, argon and helium, or heat treatment in atmosphere containing oxygen. In addition, preferably, the heat treatment is conducted at a temperature of 350° C. or more but 500° C. or less for 10 minutes or more. Still preferably, after the contact holes are formed, the heat treatment is conducted in inert gas atmosphere containing at least one of nitrogen, argon, or helium at a temperature of 350° C. or more but 500° C. or less for 10 minutes or more.

In accordance with the present invention, after a silicon oxide film was formed on the silicon substrate in a thickness of 600 nm by the high density plasma CVD process with inductively coupled plasma (ICP-CVD process), heat treatment was conducted in nitrogen atmosphere at 400° C. for 60 minutes, or in oxygen atmosphere at 400° C. for 60 minutes. The hydrogen concentration in the silicon oxide film was evaluated by SIMS analysis. In this case, the conditions for forming the silicon oxide film was to use monosilane, oxygen and argon at flow rates of 30, 40 and 30 sccm, respectively. The plasma was generated by supplying power of 3000 W at a high frequency of 2.0 MHz. In addition, 1.8 MHz RF bias of 1500 W was applied to the silicon substrate.

As shown in FIG. 1, the hydrogen concentration was significantly reduced from about $3 \times 10^{20}$ atoms/cc before the heat treatment to about $8 \times 10^{19}$ atoms/cc after the heat treatment in nitrogen atmosphere at 400° C. for 60 minutes, or to about $5 \times 10^{19}$ atoms/cc after the heat treatment in oxygen atmosphere at 400° C. for 60 minutes. Accordingly, it was found that excess hydrogen in the silicon oxide film could be removed by conducting the heat treatment after the film formation. The effect is particularly significant when the heat treatment is conducted in oxidizing atmosphere such as oxygen.

Desorption of hydrogen in the silicon oxide film was characterized by a thermal desorption spectroscopy (TDS) technique after the silicon oxide film was formed at a thickness of 600 nm on the silicon substrate by the ICP-CVD process. The temperature was raised from the ambient temperature to 350° C. in 10 minutes, and, when 350° C. was reached, maintained at that temperature for 10 minutes. Then, as shown in the TDS curve of FIG. 2, the desorption of hydrogen diminished after maintaining for 10 minutes. Therefore, it is necessary to maintain the raised temperature for at least 10 minutes in order to remove hydrogen from the silicon oxide film.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 3A:
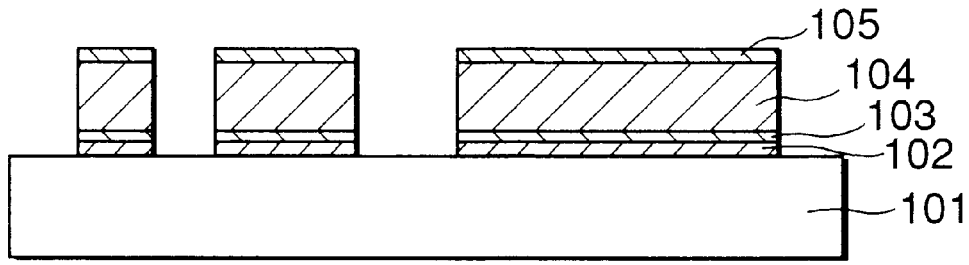
FIG. 3(a) to FIG. 3(c) are schematic sectional views of steps for manufacturing a semiconductor device illustrating an embodiment of the present invention.
Figure 3B:
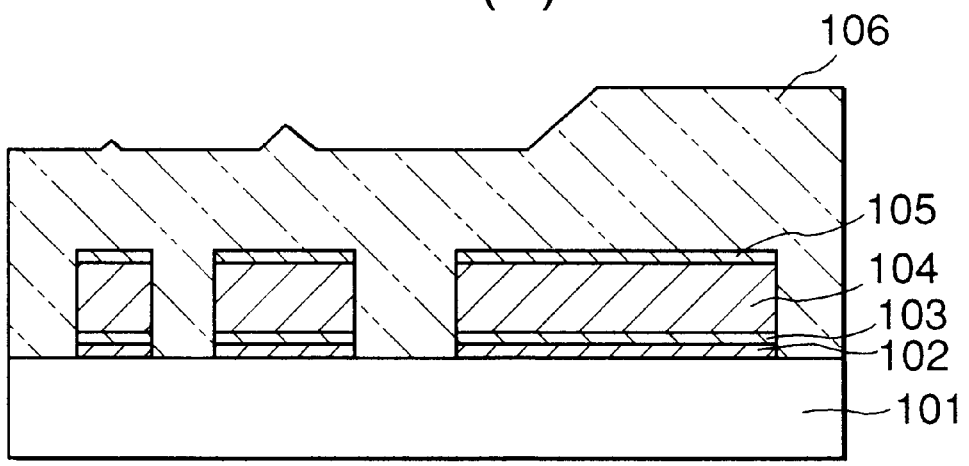
Figure 3C:
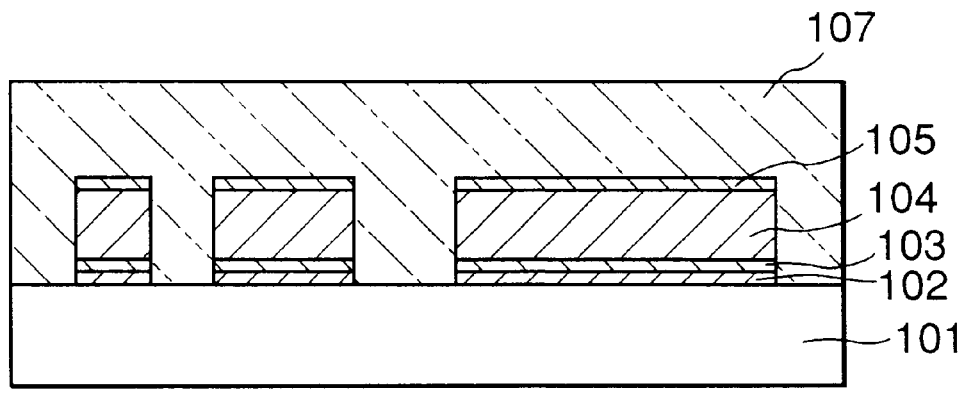
Figure 4A:
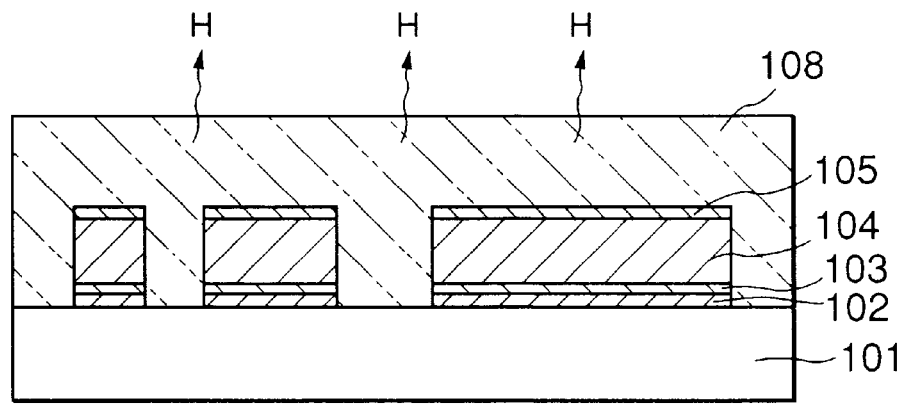
FIG. 4(a) to FIG. 4(c) are schematic sectional views of steps for manufacturing a semiconductor device illustrating an embodiment of the present invention.
Figure 4B:
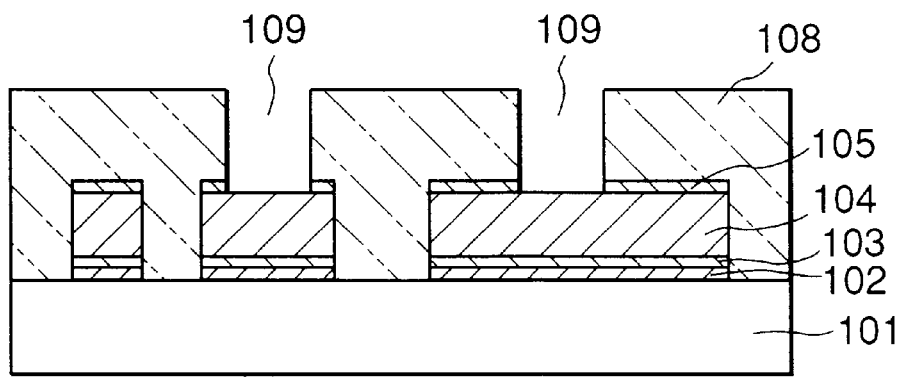
Figure 4C:
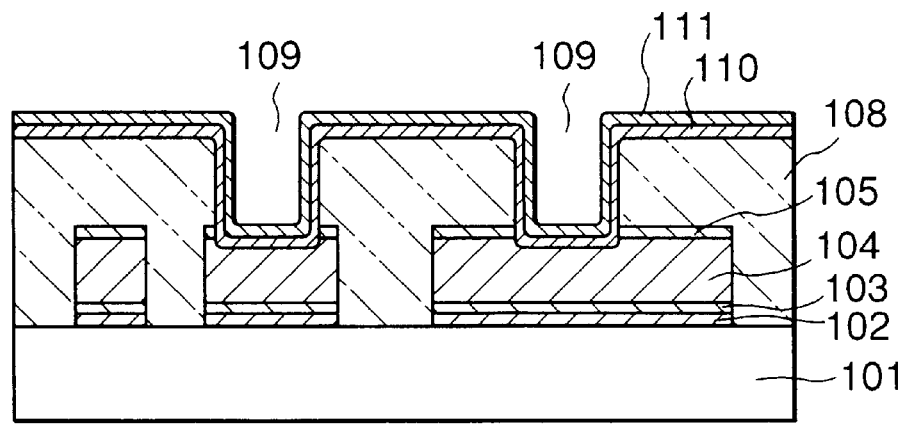

FIGS. 3–5 show sectional views of a semiconductor device at various manufacturing steps for illustrating an embodiment of the present invention.

First formed and laminated on a semiconductor substrate (silicon substrate) 101 by a sputtering process in a same chamber are a first titanium film 102 and a first titanium nitride 103, as well as first copper containing aluminum wiring 104 and a second titanium nitride film 105. Thickness is 50 nm for the first titanium film 102, 100 nm for the first titanium nitride film 103, 500mn for the first copper containing aluminum wiring 104, and 50 nm for the second titanium nitride film 105. Therefore, the underlying wiring has a height of 700 nm. The first titanium film 102 and the first titanium nitride film 103 are formed for improving migration resistance of the wiring. Containing copper in aluminum is also intended to improve the migration resistance. In addition, the second titanium nitride film 105 is used as an anti-reflection coating because, if light is reflected in performing subsequent photolithography, a desired pattern cannot be obtained. Accordingly, any film which can suppress reflection of light may be used. Then, a desired underlying wiring structure is formed by the photolithography to obtain a structure shown in FIG. 3(a).

Then, a structure shown in FIG. 3(b) is obtained by forming the silicon oxide film 106 in a thickness of 2 $\mu$m with the high density plasma CVD process with inductively coupled plasma (ICP-CVD process) and using monosilane, oxygen and argon as materials. Flow rate of each material during film formation is 30 sccm for monosilane, 40 sccm for oxygen and 30 sccm for argon. In addition, during film formation, high frequency wave is applied to the substrate at a power of 1500 W and a frequency of 1.8 MHz.

Although the embodiment uses the ICP-CVD process as the high density plasma CVD process, it is a matter of course that any other process may be used. In such case, different film formation conditions are naturally used, and conditions suitable for the process are used.

Then, the surface of the substrate is polished by chemical mechanical polishing (CMP) to planarize the surface, whereby a structure of FIG. 3(c) is obtained. The silicon oxide film 107 has a thickness of 1 $\mu$m on wide wiring of 100 $\mu$m wide after planarzation by the CMP.

Then, as shown in FIG. 4(a), heat treatment is conducted in a nitrogen atmosphere at 400° C. for 60 minutes. A vertical heat treating furnace is used for the heat treatment.

Subsequently, as shown in FIG. 4(b), contact holes (via holes) 109 are opened by photolithography and dry etching. When they are opened by the dry etching, the anti-reflection coating on the upper level of the underlying wiring is also etched to expose the copper containing film 104 on the bottom of via hole.

After the via hole 109 is opened, a second titanium film 110 and a third titanium nitride film 111 are continuously formed in a same apparatus by sputtering. In this case, the titanium film 110 has a thickness of 50 nm, while the titanium nitride film 111 has a thickness of 100 nm. In this case, the titanium film is formed to reduce resistance at the bottom of via hole. In addition, the titanium nitride film 111 is used for preventing a tungsten film subsequently formed from being peeled off, and as a stopper layer when etch back is conducted after the tungsten film is formed. If the tungsten film is directly formed on the titanium film 110, it would be peeled off. In addition, since there is a large difference in etching rate for titanium nitride and tungsten in the dry etching, when the etch back is performed to leave tungsten only within the via hole, etching can be performed without leaving tungsten in areas other than the via hole.

Figure 5A:
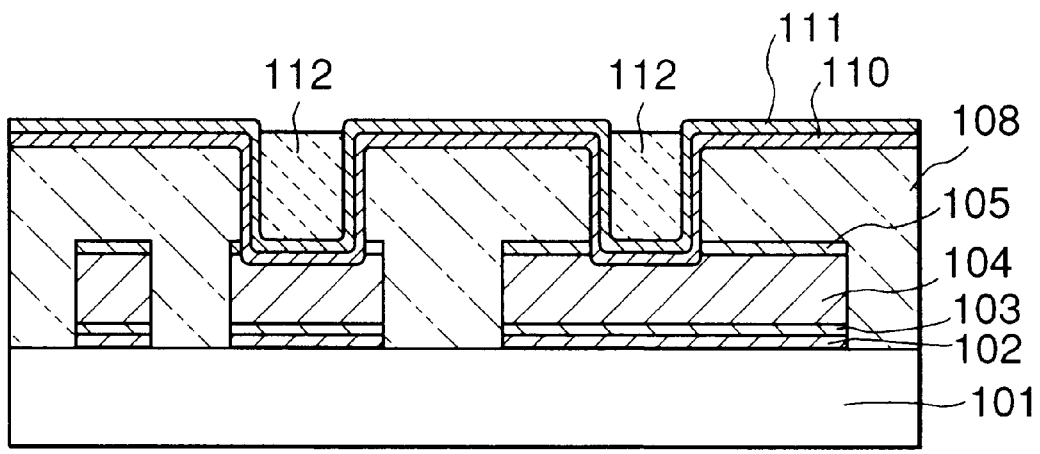
FIG. 5(a) and FIG. 5(b) are schematic sectional views of steps for manufacturing a semiconductor device illustrating an embodiment of the present invention.

Then, a tungsten film is formed on the entire surface of the substrate including the via hole, and then, the tungsten is left only within the via hole by using etch back, whereby a structure shown in FIG. 5(a) is obtained.

Figure 5B:
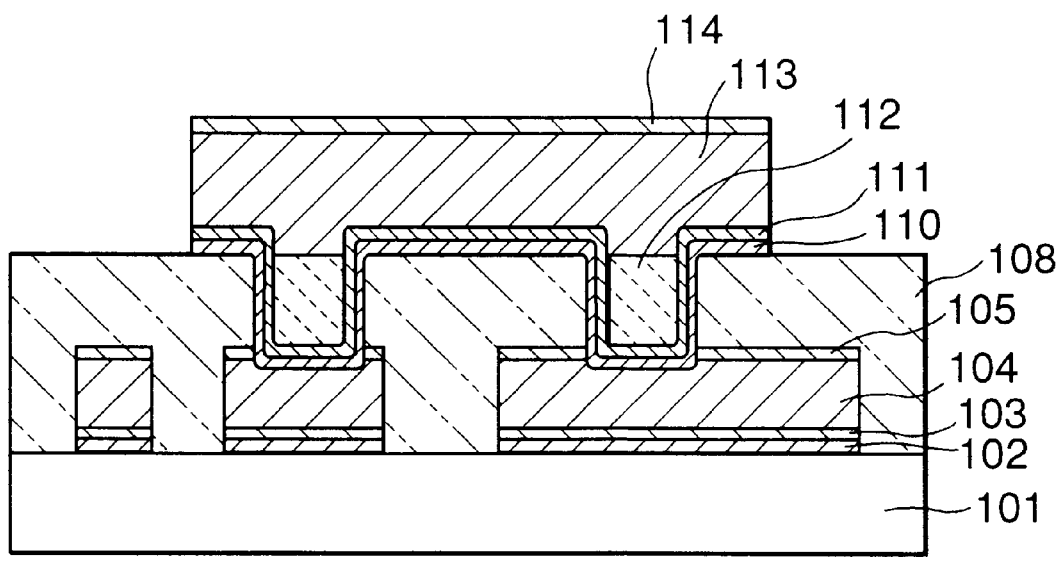

After the inside of via hole is buried with tungsten, a second copper containing aluminum layer and a fourth titanium nitride film are formed by sputtering, and upper wiring with a desired pattern is formed by photolithography and dry etching, whereby a structure shown in FIG. 5(b) is obtained. In the dry etching, the second titanium film 110 and the third titanium nitride film 111 are also simultaneously etched. The second copper containing aluminum wiring 113 has a thickness of 500 nm, while the anti-reflection coating has a thickness of 50 nm. In addition, the fourth titanium nitride film 114 is to prevent reflection as in the underlying wiring. Therefore, any material does not cause a problem as long as it can suppress reflection of light in the photolithography.

Via hole resistance was measured on the multi-level wiring structure formed by the embodiment described above immediately after its formation and after raised temperature test in nitrogen atmosphere at 500° C. for 60 minutes. In this case, the sample to be measured has 2000 via holes which were continuous through the upper and underlying wiring. The resistance was indicated as the resistance per via hole.

Figure 8:
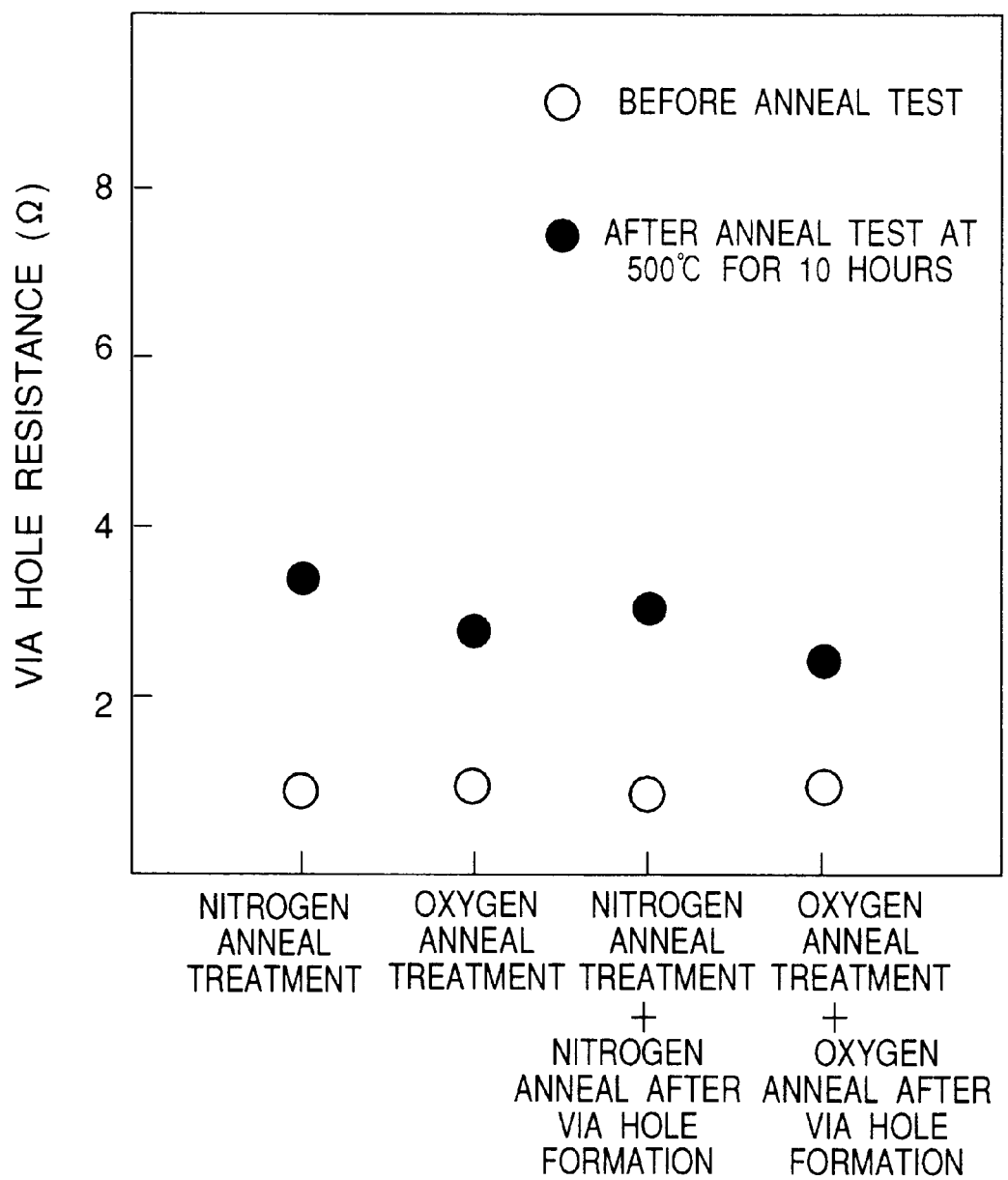
FIG. 8 is a graph for illustrating an effect of the present invention, and showing the result of evaluation on reliability of via hole resistance.
Figure 9A:
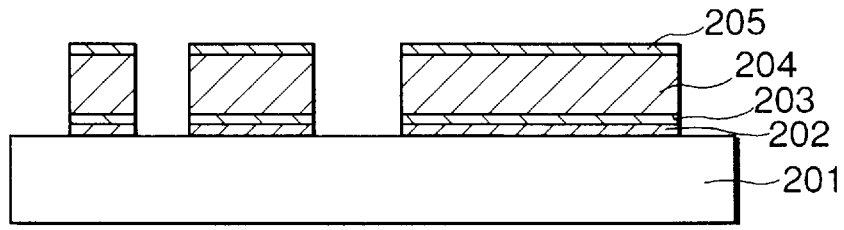
FIG. 9(a) to FIG. 9(d) are schematic sectional views showing the manufacturing steps in the conventional process.
Figure 9B:
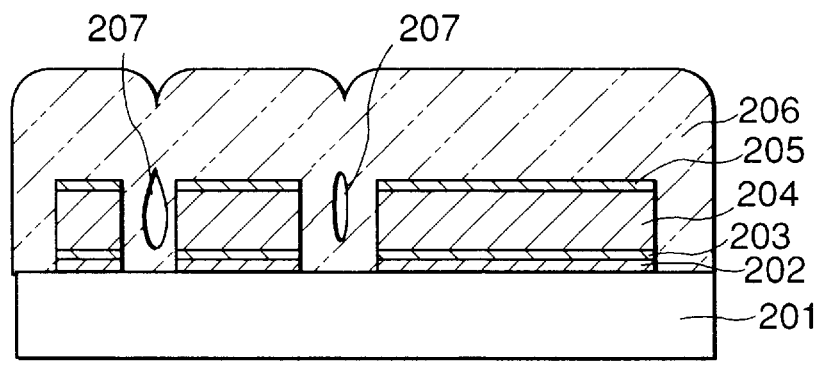
Figure 9C:
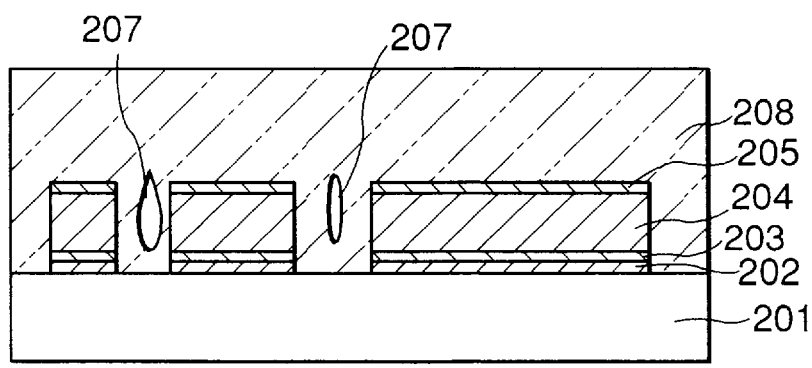
Figure 9D:
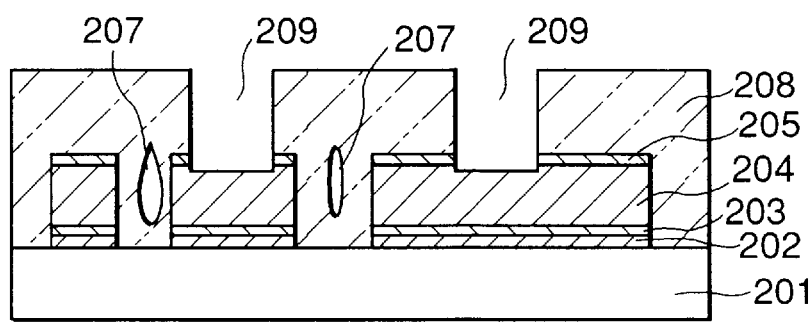
Figure 10A:
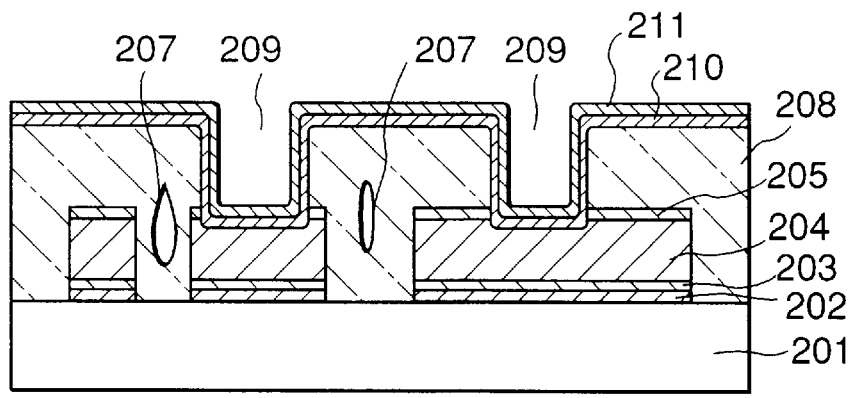
FIG. 10(a) to FIG. 10(c) are schematic sectional views showing the manufacturing steps in the conventional process.
Figure 10B:
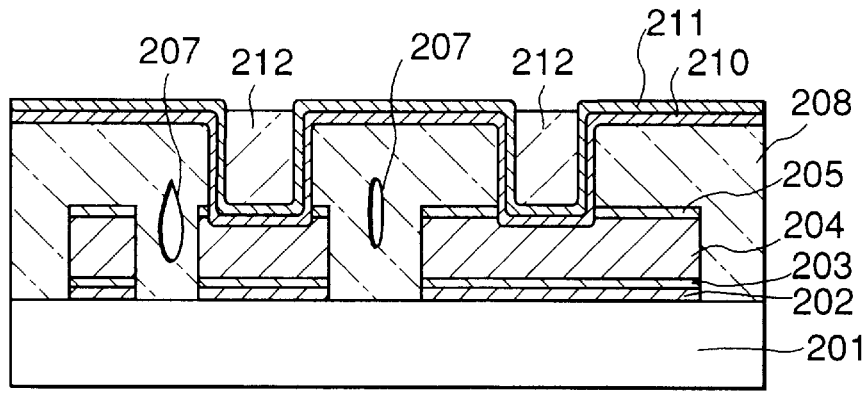
Figure 10C:
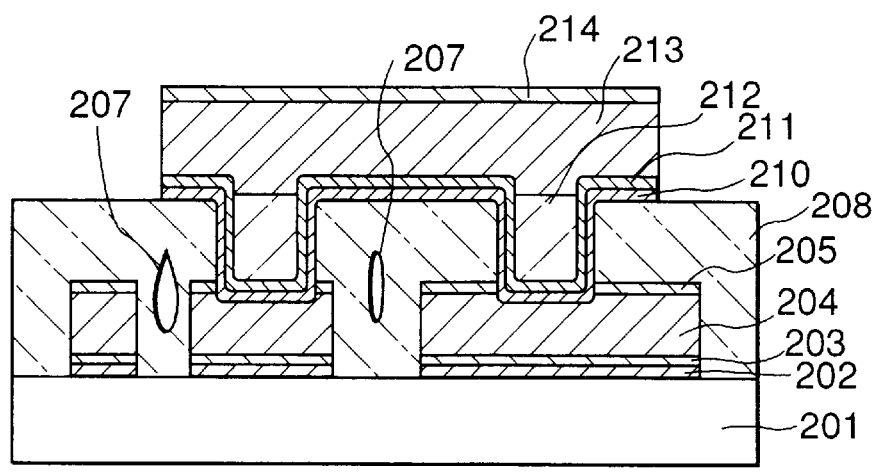
Figure 11:
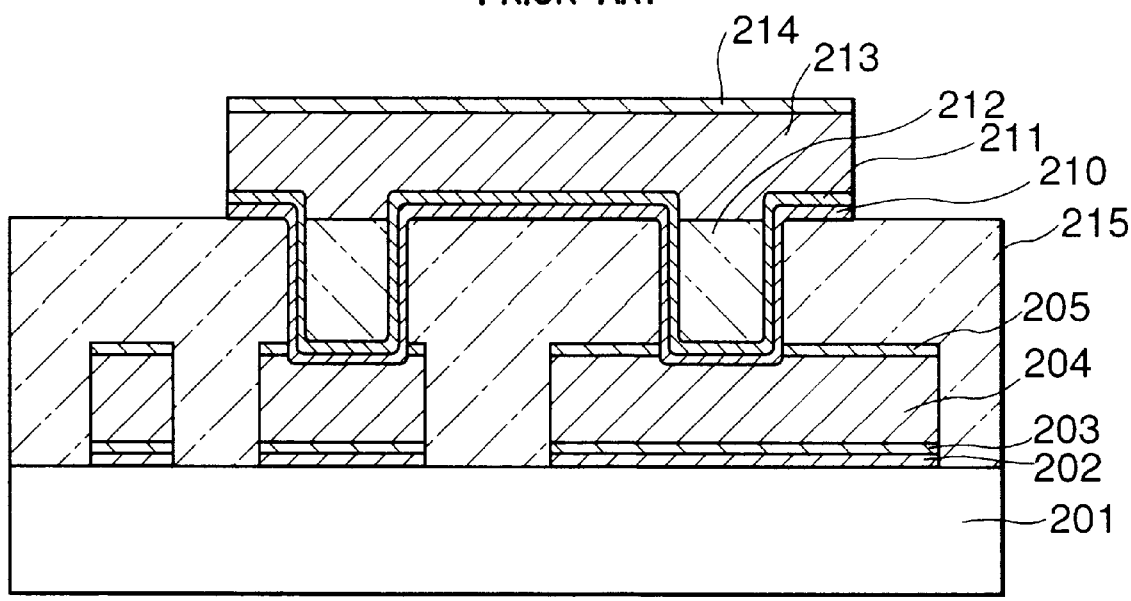
FIG. 11 is schematic sectional views showing the manufacturing steps in the conventional process.
Figure 12:
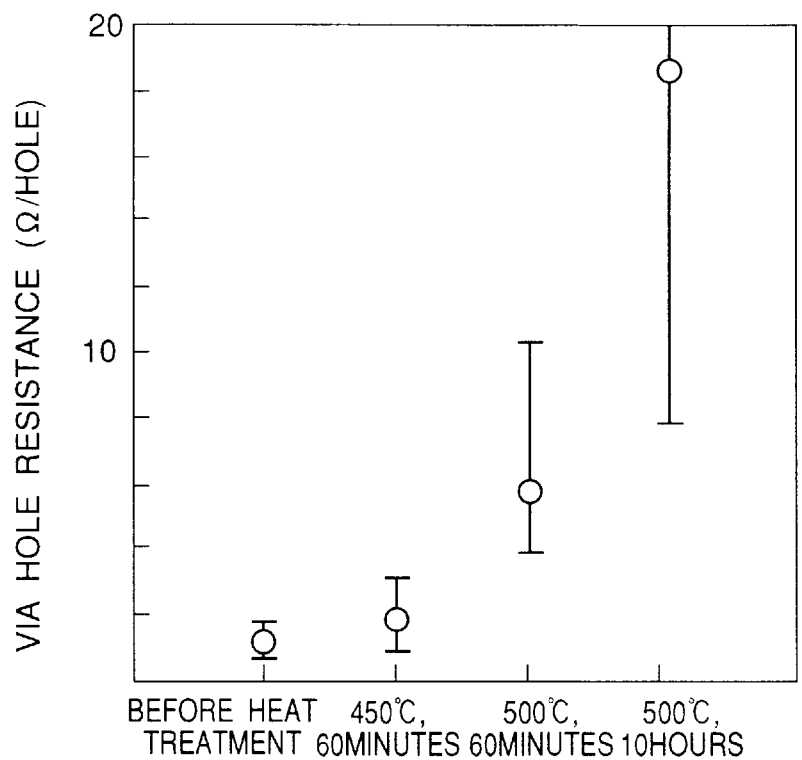
FIG. 12 is a graph showing the result of reliability test on via hole resistance for illustrating problems in the conventional process.
Figure 13:
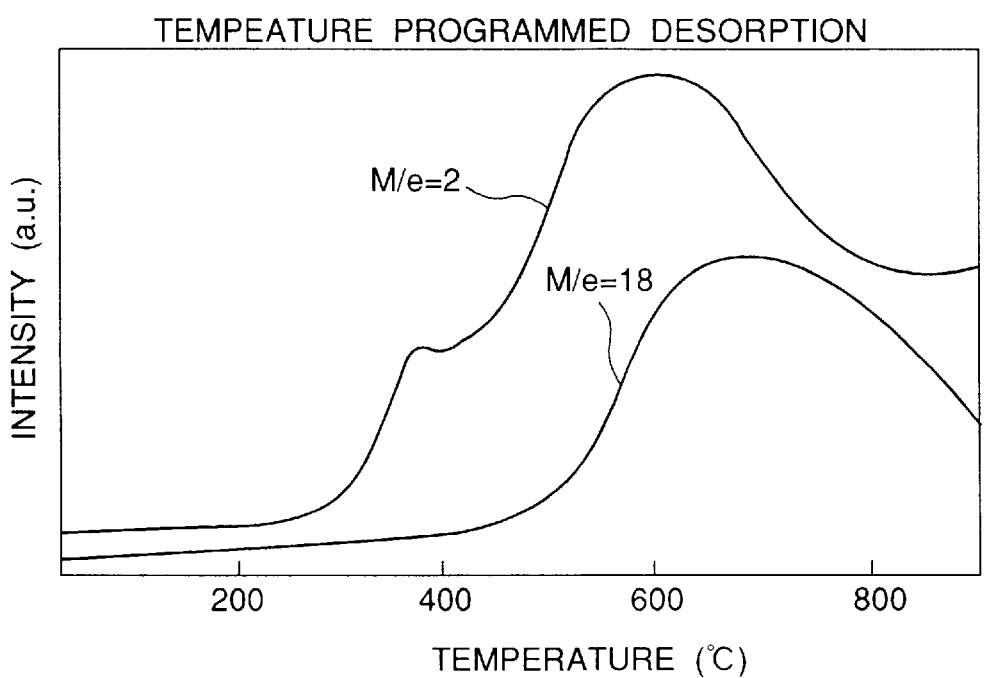
FIG. 13 is a Temperature Programmed Desorption (TPD) spectrum.
Figure 14:
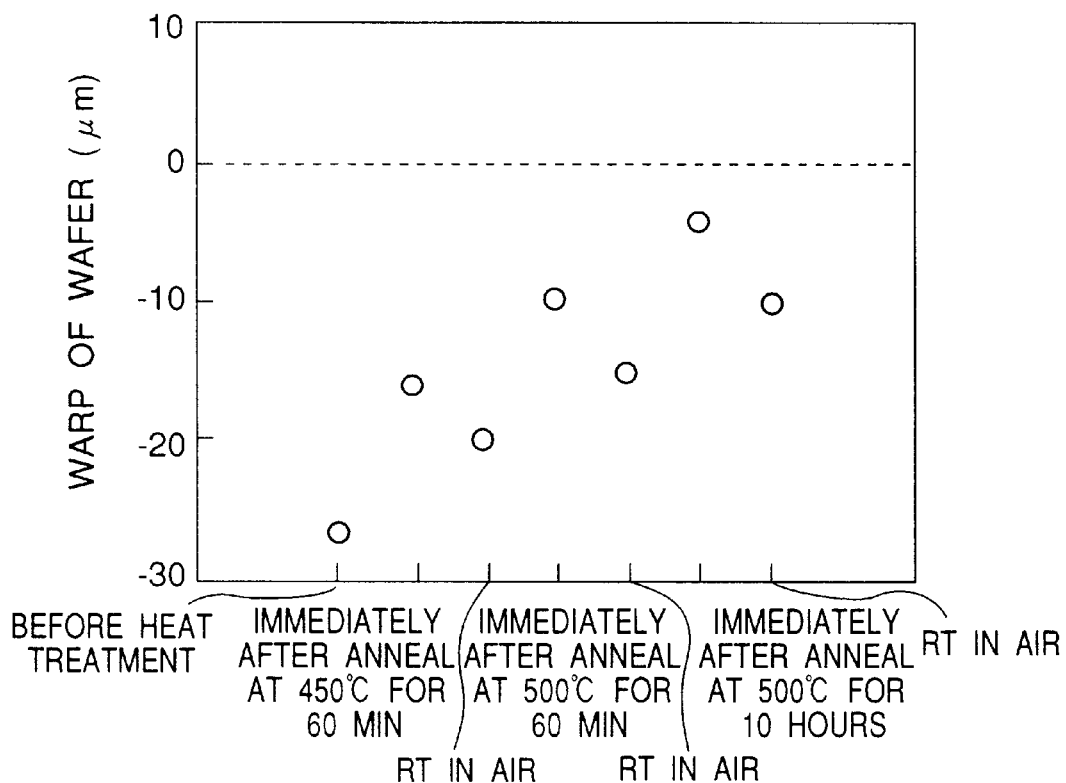
FIG. 14 is a diagram showing changes of warp of a wafer in the reliability test for illustrating problems in the conventional process.
Figure 15:
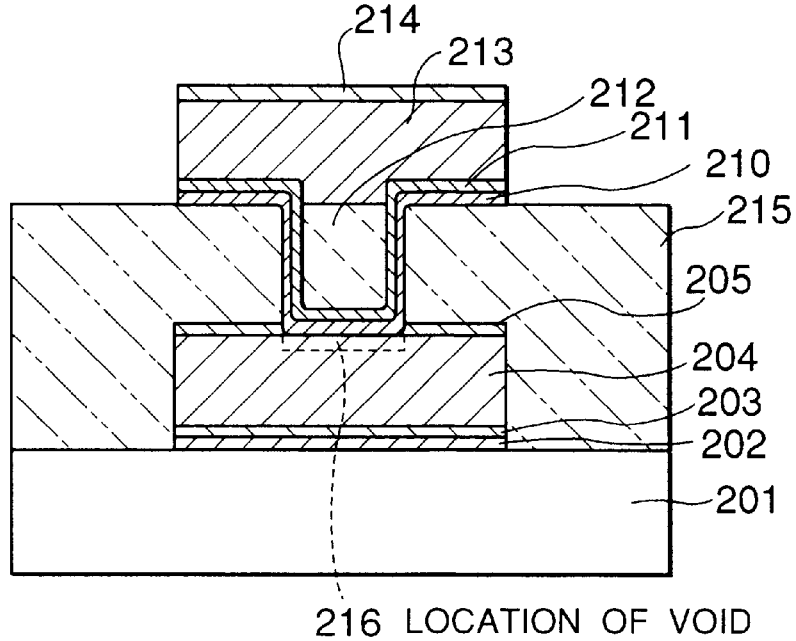
FIG. 15 is a schematic representation of an SEM cross section of a via hole after the reliability test for illustrating problems in the conventional process.

Consequently, as shown in FIG. 8, the via hole resistance increased only by 4.5 times before and after the raised temperature test. This exhibits that the reliability was significantly improved over the conventional process by heat treating the silicon oxide film formed by the high density plasma CVD process after its formation.

Figure 1:
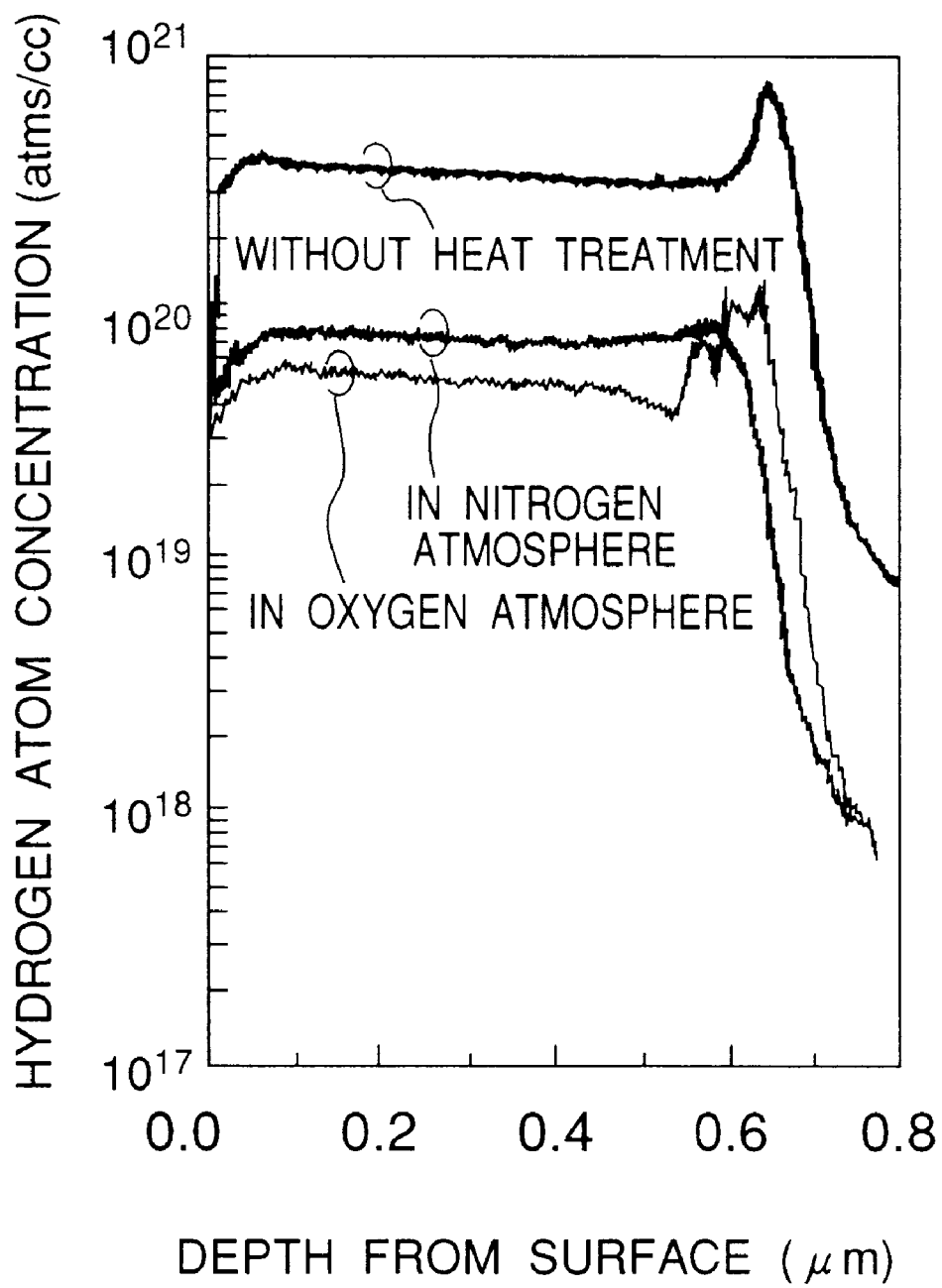
FIG. 1 is a depth profile of H atoms obtained by Secondary Ion Mass Spectroscopic (SIMS) analysis.
Figure 2:
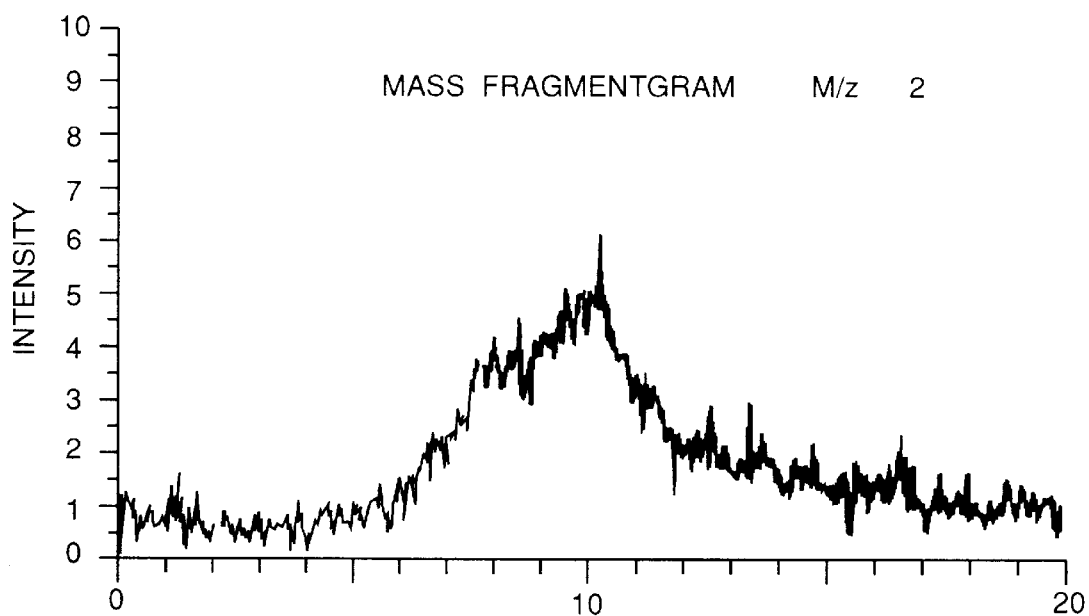
FIG. 2 is a Thermal Desorption Spectrum.
Figure 6:
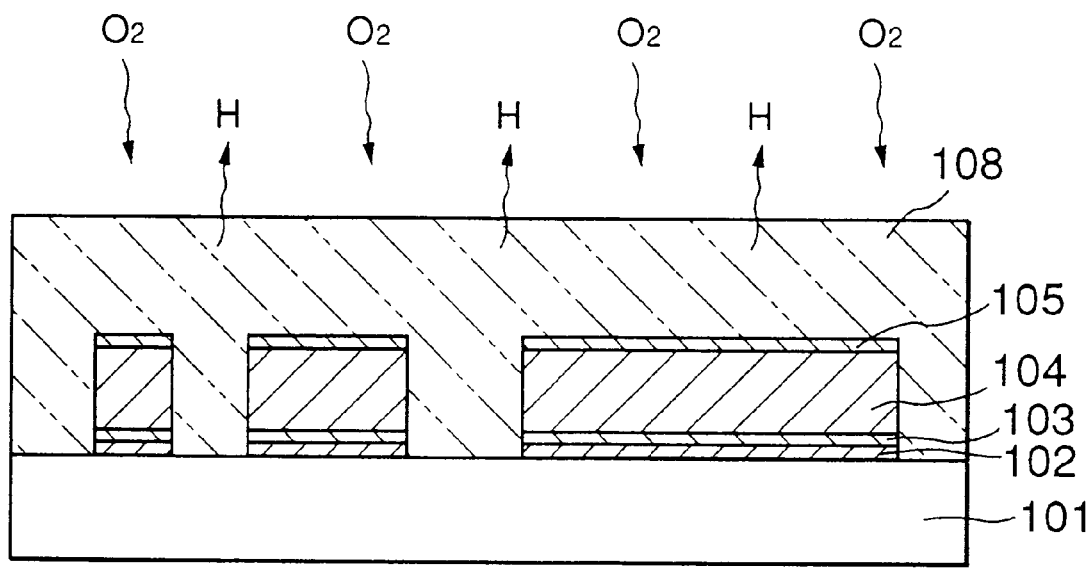
FIG. 6 is schematic sectional views of a semiconductor device at various manufacturing steps for showing an alternative embodiment of the present invention.

Now, a second embodiment is described. In the second embodiment of the present invention, the heat treatment for the silicon oxide film performed in the first embodiment is performed in oxygen atmosphere as shown in FIG. 6. When the heat treatment is performed in oxygen atmosphere as shown in FIG. 1, hydrogen in the silicon oxide film becomes less than in the case of heat treatment performed in nitrogen atmosphere as shown in FIG. 1, so that a via hole with higher reliability can be formed.

As the result of the heat treatment for the silicon oxide in oxygen atmosphere, the via hole has a slightly higher resistance before the raised temperature test. This increase of resistance is at magnitude not to cause a problem in adaptation for the device. The raised temperature test in nitrogen atmosphere at 500° C. for 60 minutes revealed that the via hole resistance increased by about 2.8 times than that before the raised temperature test, as shown in FIG. 8. Thus, it was possible to form a via hole with further higher reliability than when the heat treatment was performed in nitrogen atmosphere.

Figure 7:
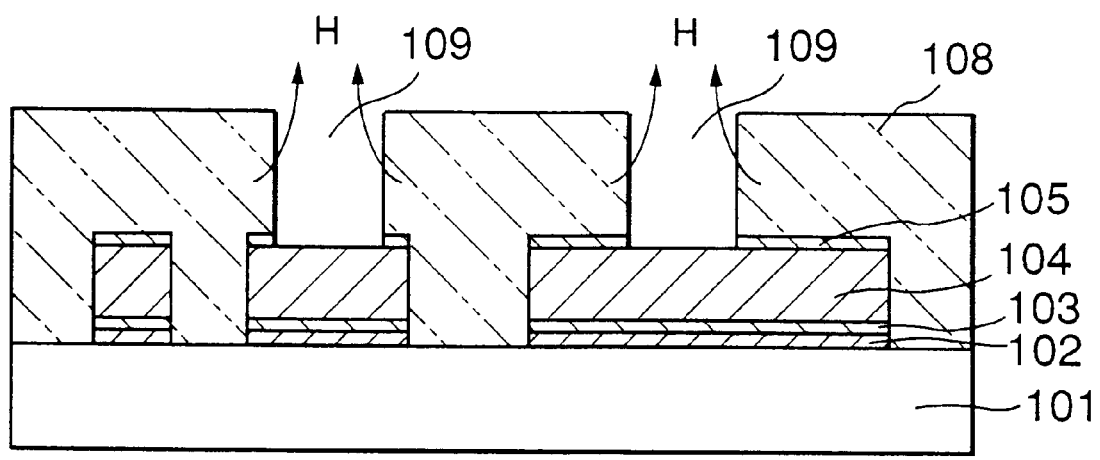
FIG. 7 is schematic sectional views of a semiconductor device at various manufacturing steps for showing an alternative embodiment of the present invention.

Then, in a third embodiment of the present invention, in addition to the heat treatment in the first and second embodiments, heat treatment is performed after the via holes are opened as shown in FIG. 7, so that it becomes possible to form via holes with further higher reliability. In this case, atmosphere for the heat treatment is required to be of inert gas. This is because the underlying wiring is exposed after the via holes are opened, and, if the heat treatment is performed in oxidizing atmosphere, the underlying wiring is oxidized to increase the resistance.

The via hole resistance after the heat treatment in nitrogen atmosphere at 400° C. for 60 minutes was measured before and after raised temperature test. The measurement revealed that the resistance increased by about 3.5 times when the silicon oxide film was heat treated in nitrogen atmosphere, and by about 2.5 times when it is performed in oxygen atmosphere, as shown in FIG. 8. Thus, further higher improvement can be attained.

A major advantage of the present invention lies in that the reliability of via hole is not deteriorated even when a silicon oxide film formed by the high density plasma-bias CVD process is used as an inter-level dielectric film.

A silicon oxide film formed by the high density plasma-bias CVD process contains much amount of excess hydrogen therein, and the reliability is deteriorated when the hydrogen is desorbed. However, if hydrogen is removed through heat treatment in inert gas or oxygen atmosphere subsequent to film formation, hydrogen can be suppressed from being desorbed from the silicon oxide film during heat treatment in the process steps that come after the film formation. If the silicon oxide film used as the inter-level dielectric film contains much amount of excess hydrogen, the hydrogen is desorbed during the heat treatment after the formation of the silicon oxide film. Titanium forms volatile $TiH_x$ reacting hydrogen. In addition, warp of the wafer is significantly varied as hydrogen is desorbed. If a titanium film exists on the bottom of via hole, contact on the bottom of via hole is weakened, and a large force is applied to the bottom of via hole as the warp of wafer is changed, so that a part of the bottom of the via hole is peeled off and the resistance of the via hole is increased. Accordingly, previously removing excess hydrogen in the silicon oxide film makes it possible to form a multi-level wiring structure in which the resistance of via hole is not increased.

While the present invention has been described in connection with certain preferred embodiments, it is to be understood that the subject matter encompassed by way of the present invention is not to be limited to those specific embodiments. On the contrary it is intended for the subject matter of the invention to include all alternatives, modifications and equivalents as can be included within the spirit and scope of the following claims.

What is claimed is:

1. A method of manufacturing a semiconductor device having an underlying wiring, inter-level dielectric film and an upper wiring on a semiconductor substrate, said method comprising the steps of:

forming an inter-level dielectric film on said underlying wiring, said inter-level dielectric film including a silicon oxide film formed by a high density plasma chemical vapor deposition process using at least monosilane and oxygen as source materials and applying high frequency power on said semiconductor substrate;

removing excess hydrogen in said silicon oxide film;

forming contact holes in the inter-level dielectric film for electrically connecting said upper wiring and said underlying wiring; and forming said upper wiring after said step of removing the excess hydrogen.

2. The method of manufacturing a semiconductor device as claimed in claim 1, wherein said upper wiring has a laminated structure with a titanium layer as the lowest layer.

3. The method of manufacturing a semiconductor device as claimed in claim 2, wherein the process for generating high density plasma is any one of a process using electron cyclotron resonance, a process using helicon wave, or a process using inductively coupled plasma.

4. The method of manufacturing a semiconductor device as claimed in claim 3, wherein said step of removing excess hydrogen in the silicon oxide film is a heat treatment in an atmosphere containing at least one of nitrogen, argon and helium.

5. The method of manufacturing a semiconductor device as claimed in claim 3, wherein said step of removing excess hydrogen in the silicon oxide film is a heat treatment in an atmosphere containing oxygen.

6. The method of manufacturing a semiconductor device as claimed in claim 4, wherein said heat treatment is conducted at a temperature in the range of 350° C. to 500° C. for 10 minutes or more.

7. The method of manufacturing a semiconductor device as claimed in claim 5, wherein said beat treatment is conducted at a temperature in the range of 350° C. to 500° C. for 10 minutes or more.

8. The method of manufacturing a semiconductor device as claimed in claim 6, wherein after said contact hole is formed, a heat treatment is conducted in an inert gas atmosphere at a temperature in the range of 350° C. to 500° C. for 10 minutes or more.

9. The method of manufacturing a semiconductor device as claimed in claim 7, wherein after said contact hole is formed, a heat treatment is conducted in an inert gas atmosphere at a temperature in the range of 350° C. to 500° C. for 10 minutes or more.

10. The method of manufacturing a semiconductor device as claimed in claim 8, wherein said inert gas contains at least one of nitrogen, argon and helium.

11. The method of manufacturing a semiconductor device as claimed in claim 9, wherein said inert gas contains at least one of nitrogen, argon and helium.

* * * * *